US012575346B2

(12) United States Patent
Tajima et al.

(10) Patent No.: US 12,575,346 B2
(45) Date of Patent: Mar. 10, 2026

(54) METHOD FOR TREATING SURFACE OF SUBSTRATE, METHOD FOR REGION-SELECTIVELY PRODUCING FILM ON SURFACE OF SUBSTRATE, AND SURFACE TREATMENT AGENT

(71) Applicant: TOKYO OHKA KOGYO CO., LTD., Kawasaki (JP)

(72) Inventors: Kazuya Tajima, Kawasaki (JP); Kenji Seki, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 528 days.

(21) Appl. No.: 18/057,648

(22) Filed: Nov. 21, 2022

(65) Prior Publication Data

US 2023/0187200 A1 Jun. 15, 2023

(30) Foreign Application Priority Data

Dec. 13, 2021 (JP) ................................. 2021-202021

(51) Int. Cl.

| | |
|---|---|
| ***H01L 21/02*** | (2006.01) |
| ***C08G 77/62*** | (2006.01) |
| ***C09D 183/14*** | (2006.01) |
| ***C23C 16/02*** | (2006.01) |
| ***C23C 16/40*** | (2006.01) |
| ***C23C 16/455*** | (2006.01) |

(52) U.S. Cl.

CPC ........ *H01L 21/02118* (2013.01); *C08G 77/62* (2013.01); *C09D 183/14* (2013.01); *C23C 16/0272* (2013.01); *C23C 16/403* (2013.01); *C23C 16/45527* (2013.01); *H01L 21/0228* (2013.01)

(58) Field of Classification Search

CPC ........... H01L 21/0228; H01L 21/02118; C23C 16/45527; C23C 16/403; C23C 16/0272

See application file for complete search history.

(56) References Cited

U.S. PATENT DOCUMENTS

| | | | | |
|---|---|---|---|---|
| 2018/0277357 | A1* | 9/2018 | Wojtczak | B08B 3/08 |
| 2019/0164758 | A1* | 5/2019 | Su | H10D 64/01 |
| 2019/0203054 | A1* | 7/2019 | Seki | H01L 21/32051 |

FOREIGN PATENT DOCUMENTS

| | | | |
|---|---|---|---|
| JP | 2003-508897 | A | 3/2003 |
| JP | 2019-121777 | A | 7/2019 |
| WO | WO 01/15220 | A1 | 3/2001 |

OTHER PUBLICATIONS

Glass et al. Biomicrofluidics 5, 036501 (2011) (Year: 2011).*

Hashemi et al., "A New Resist for Area Selective Atomic and Molecular Layer Deposition on Metal-Dielectric Patterns", J. Phys. Chem. C 2014, 118, 10957-10962, 2014.

* cited by examiner

*Primary Examiner* — Kelly M Gambetta

(74) *Attorney, Agent, or Firm* — Knobbe, Martens, Olson & Bear, LLP

(57) ABSTRACT

A method for treating surface of substrate, the method including forming a film including a high molecular weight condensate of a silylation agent on the surface thereof to allow a substrate having a plurality of regions to be modified at modification degrees that are different depending on materials of the regions on a surface of the substrate. The method includes preparing a substrate having a surface including two or more regions having different materials; exposing the surface to a surface treatment agent; and baking the substrate, the method not including rinsing the surface with a liquid between the exposing and the baking, the surface treatment agent including a silylation agent and not a nitrogen-containing heterocyclic compound, the silylation agent including organomonosilane that has 2 to 4 nitrogen atoms bonded to a silicon atom.

6 Claims, No Drawings

METHOD FOR TREATING SURFACE OF SUBSTRATE, METHOD FOR REGION-SELECTIVELY PRODUCING FILM ON SURFACE OF SUBSTRATE, AND SURFACE TREATMENT AGENT

CROSS-REFERENCE TO RELATED APPLICATIONS

This application is claims of priority TO Japanese Patent Application 2021-202021, filed Dec. 13, 2021, the entire content of which is incorporated herein by reference.

BACKGROUND OF THE INVENTION

Field of the Invention

The present invention relates to a method for treating a surface of a substrate, a method for region-selectively producing a film on a surface of a substrate, and a surface treatment agent for use in the above-mentioned methods.

Related Art

In recent years, trends toward higher integration and miniaturization of semiconductor devices have grown, and thus miniaturization of patterned organic films serving as a mask and patterned inorganic films prepared by an etching process has advanced. Thus, film thickness control at an atomic layer level has been demanded for organic films or inorganic films formed on semiconductor substrates. As a method for forming a thin film on a substrate at the atomic layer level, an atomic layer deposition (ALD) method (hereinafter, also simply referred to as an "ALD method") has been known. The ALD method is known to have a higher step difference covering property (step coverage) and film-thickness controllability as compared with a general chemical vapor deposition (CVD) method.

The ALD method is a thin-film forming technique in which alternate supply of two types of gases mainly composed of elements constituting a film to be formed onto a substrate, and formation of a thin film in an atomic layer unit on the substrate are repeated a plurality of times, thereby forming a film having a desired thickness. The ALD method uses a deposition self-controlling function (self-limiting function), in which, during supply of raw material gases, only enough components of the raw material gases to form one or a few atomic layers are adsorbed onto a surface of a substrate, while excess raw material gas does not contribute to the deposition. For example, to form an $Al_2O_3$ film on a substrate, a raw material gas composed of TMA (trimethyl aluminum) and an oxidizing gas including oxygen are used. To form a nitride film on a substrate, a nitriding gas is used instead of the oxidizing gas.

In recent years, a method for region-selectively producing a film on a surface of a substrate has been attempted by using the ALD method (see Patent Document 1 and Non-Patent Document 1). Due to this, a substrate having a surface region-selectively modified has been demanded so that the surface can be suitably applied in the method for region-selectively producing a film on the substrate by the ALD method. As a method for obtaining a substrate having such a region-selectively modified surface, there has been a method for surface-treating a surface of a substrate, the method including exposing the surface to a surface treatment agent including a silylation agent (A) and a nitrogen-containing heterocyclic compound (B), the surface including two or more regions, adjacent regions in the two or more regions having different materials from each other, and a reaction between the silylation agent and the two or more regions causing contact angles of water to differ from each other on the adjacent regions in the two or more regions (see Patent Document 2).

Patent Document 1: Japanese Unexamined Patent Application (Translation of PCT Application), Publication No. 2003-508897

Patent Document 2: Japanese Unexamined Patent Application, Publication No. 2019-121777

Non-Patent Document 1: J. Phys. Chem. C 2014, 118, 10957-10962

SUMMARY OF THE INVENTION

Such a surface treatment agent including a silylation agent is desired to have a high modification effect on a region to be modified on a surface of a substrate. In order to enhance the modification effect on the region to be modified on the surface of the substrate, it is contemplated to form a film having a high molecular weight on the region to be modified on the surface of the substrate using the surface treatment agent including a silylation agent.

The present invention has been made considering the above situation, and has an object to provide a method for treating a surface of a substrate, the method including forming a film that is composed of a high molecular weight condensate of a silylation agent on the surface of the substrate to allow a substrate having a plurality of regions to be modified (for example, imparted with water repellency or imparted with an inhibiting effect for film formation by an ALD method) at modification degrees that are different depending on materials of the regions on a surface of the substrate; a method for region-selectively producing a film on a surface of a substrate; and a surface treatment agent for use in the above-mentioned methods.

The present inventors have found that a film composed of a high molecular weight condensate of a silylation agent can be formed on a surface of a substrate and a modification degree can be changed depending on materials of the surface of the substrate by exposing the surface of the substrate to a surface treatment agent including a silylation agent (A) and not including nitrogen-containing heterocyclic compound (B), the silylation agent (A) including organomonosilane, and the organomonosilane including 2 or more and 4 or less nitrogen atoms bonded to a silicon atom, and then baking the substrate without rinsing. Thus, the present invention has been completed. Specifically, the present invention provides the following.

A first aspect of the present invention is a method for treating a surface of a substrate, the method including:

preparing a substrate having a surface including two or more regions having different materials from each other;

exposing the surface of the substrate to a surface treatment agent; and baking the substrate after the exposing;

the method not including rinsing the surface of the substrate with a liquid between the exposing and the baking, the surface treatment agent including a silylation agent (A) and not including a nitrogen-containing heterocyclic compound (B), the silylation agent (A) including organomonosilane, and the organomonosilane including 2 or more and 4 or less nitrogen atoms bonded to a silicon atom.

A second aspect of the present invention is a method for region-selectively producing a film on a surface of a substrate, the method including:

treating the surface of the substrate by the method for treating a surface of a substrate according to the first aspect, and forming a film by an atomic layer deposition method on the surface of the substrate having been surface-treated, a material of the film being deposited in region-selectively different amounts.

A third aspect of the present invention is a surface treatment agent for use in the method for treating a surface of a substrate according to the first aspect, the surface treatment agent including a silylation agent (A) and not including a nitrogen-containing heterocyclic compound (B), the silylation agent (A) including organomonosilane, and the organomonosilane including 2 or more and 4 or less nitrogen atoms bonded to a silicon atom.

The present invention can provide a method for treating a surface of a substrate, the method including forming a film that is composed of a high molecular weight condensate of a silylation agent on the surface of the substrate to allow a substrate having a plurality of regions to be modified (for example, imparted with hydrophobicity or imparted with an inhibiting effect for film formation by an ALD method) at modification degrees that are different depending on materials of the regions on a surface of the substrate; a method for region-selectively producing a film on a surface of a substrate; and a surface treatment agent for use in the above-mentioned methods.

DETAILED DESCRIPTION OF THE INVENTION

Although embodiments of the present invention will be described hereafter in detail, the present invention is not limited to the embodiments below in any way and can be implemented with modifications as appropriate within the scope of the object of the present invention.

<<Method for Treating Surface of Substrate and Surface Treatment Agent for Use in Method for Treating Surface of Substrate>>

The method for treating a surface of a substrate according to the first aspect includes preparing a substrate having a surface including two or more regions having different materials from each other; exposing the surface of the substrate to a surface treatment agent; and baking the substrate after the exposing, but does not include rinsing the surface of the substrate with a liquid between the exposing and the baking. The surface treatment agent includes a silylation agent (A) but does not include a nitrogen-containing heterocyclic compound (B). The silylation agent (A) includes organomonosilane and the organomonosilane includes 2 or more and 4 or less nitrogen atoms bonded to a silicon atom. Hereinafter, each step will be described.

<Substrate Preparation Step>

In a substrate preparation step, a substrate having a surface includes two or more regions having different materials from each other is prepared. A substrate to be prepared in the substrate preparation step, in other words, a substrate to be surface-treated in the method for treating a surface of a substrate is a substrate having a surface including two or more regions having different materials from each other. As the "substrate", a substrate for use in producing semiconductor devices is exemplified, and examples of the substrate include a silicon (Si) substrate, a silicon nitride (SiN) substrate, a silicon oxide film (SiOx) substrate, a tungsten (W) substrate, a cobalt (Co) substrate, a titanium nitride (TiN) substrate, a tantalum nitride (TaN) substrate, a germanium (Ge) substrate, a silicon germanium (SiGe) substrate, an aluminum (Al) substrate, a nickel (Ni) substrate, a ruthenium (Ru) substrate, a copper (Cu) substrate, and the like. As the "surface" of a substrate, a surface of the substrate itself, as well as a surface of a patterned inorganic or organic layer and a surface of an unpatterned inorganic or organic layer provided on the substrate are exemplified.

As the patterned inorganic layer provided on the substrate, a patterned inorganic layer formed by producing an etching mask on a surface of an inorganic layer present on the substrate by means of a photoresist method and then subjecting the etching mask to an etching process; and a patterned inorganic layer formed on the surface of the substrate by means of the atomic layer deposition (ALD method) are exemplified. Note that, the surface treatment agent according to the present aspect can be also used to a patterned inorganic layer on the surface of the substrate by the ALD method. As the inorganic layer, the substrate itself as well as an oxide film of an element constituting the substrate, and a film or layer, etc. of an inorganic substance such as SiN, SiOx, W, Mo, Co, TiN, TaN, Ge, SiGe, Al, Ni, Ru, Cu, and the like formed on the surface of the substrate are exemplified. Although such a film or layer is not particularly limited, a film or layer of an inorganic substance, etc. that is formed in a manufacturing process of semiconductor devices is exemplified. As the unpatterned inorganic layer provided on the substrate, a film or layer of an inorganic substance composed of the same material as that of the patterned inorganic layer provided on the substrate is exemplified.

As the patterned organic layer provided on the substrate, a patterned resin layer formed on a substrate by means of a photolithography method using photoresist and the like are exemplified. Such a patterned organic layer can be formed, for example, by forming an organic layer, which is a film of photoresist, on the substrate, exposing this organic layer through a photomask, and developing. In addition to a surface of the substrate itself, the organic layer may also be an organic layer that is provided on a surface or the like of a laminated film provided on the surface of the substrate. Although such an organic layer is not particularly limited, a film of an organic substance provided in order to form an etching mask in a manufacturing process of semiconductor devices can be exemplified. As the unpatterned organic layer provided on the substrate, a film or a layer of an organic substance composed of the same material as that of the patterned organic layer provided on the substrate is exemplified.

(Pretreatment of Surface of Substrate)

The surface of the substrate may be pretreated. A treatment agent for pretreating the surface of the substrate (hereinafter, sometimes referred to as "pretreatment agent") is not particularly limited as long as it can remove a natural oxide film present on the surface of the substrate and impart a hydroxy group to the surface of the substrate. Imparting a hydroxy group in advance improves water repellency of the surface of the substrate after treatment with the surface treatment agent. Specific examples of the pretreatment agent include peroxides such as hydrogen peroxide, perhalogenic acids such as periodic acid, oxo acids such as nitric acid and hypochlorous acid, phosphoric acid, citric acid, acetic acid, or hydrofluoric acid (HF). The pretreatment agent may be appropriately selected depending on types of substrates to be used, and for example, in a case of a substrate including W or Ru, at least one selected from the group consisting of hydrogen peroxide and perhalogenic acids is preferred. Further, the at least one selected from the group consisting of hydrogen peroxide and perhalogenic acids is also preferred in the case in which an inorganic substance such as $SiO_2$ and $Al_2O_3$ coexists therewith on the surface of the substrate, from the viewpoint of treating a metal surface without damaging the inorganic substance. On the other hand, in the case of a substrate including Cu, an aqueous HF solution, acetic acid, citric acid, phosphoric acid, or nitric acid is preferably used as the pretreatment agent from the viewpoints of removability of the natural oxide film and improvement in hydrophilicity of the surface of the substrate. The pretreatment agent may be used alone, or two or more types thereof may be used. Note that, the substrate is preferably dried after pretreatment with the pretreatment agent.

(Two or More Regions Having Different Materials from Each Other)

Two or more regions having different materials from each other are preferably at least two regions (e.g., an insulator region and a metal region) adjacent to each other. Herein, the term "adjacent" includes a case in which at least one region (e.g., insulator region) and at least one other region (e.g., metal region) are adjacent to each other with a boundary line being shared or a case in which they are adjacent to each other without sharing a boundary line or spaced apart.

The "two or more regions" in the substrate having a surface including two or more regions having different materials from each other preferably include at least one insulator region and at least one metal region. The metal region includes a metal or a conductive metal-containing compound. The metal region may be defined as a conductor region contrary to the below-mentioned insulator region. As the metal, copper (Cu), cobalt (Co), aluminum (Al), silver (Ag), nickel (Ni), titanium (Ti), gold (Au), chromium (Cr), molybdenum (Mo), tungsten (W), ruthenium (Ru), titanium nitride (TiN), tantalum nitride (TaN), and the like are preferred among the above-mentioned inorganic substances. The insulator region (also referred to as "high-resistor element) is composed of one or more insulating compounds selected from the group consisting of oxides, nitrides, carbides, carbonitrides, oxynitrides, oxycarbonitrides, and insulating resins; or semi-conductors. The insulating compounds are preferably oxides, nitrides, carbides, carbonitrides, oxynitrides, or oxycarbonitrides. Preferable examples of the oxides include aluminum oxide ($Al_2O_3$), titanium oxide ($TiO_2$), zirconium oxide ($ZrO_2$), hafnium oxide ($HfO_2$), tantalum oxide ($Ta_2O_5$), silicon oxide ($SiO_x$ ($1 \leq X \leq 2$)), fluorine-containing silicon oxide (SiOF), and carbon-containing silicon oxide (SiOC). Preferable examples of the nitrides include silicon nitride (SiN) and boron nitride (BN). Preferable examples of the carbides include silicon carbide (SiC). Preferable examples of the carbonitrides include silicon carbonitride (SICN). Preferable examples of the oxynitrides include silicon oxynitride (SiON). Preferable examples of the oxycarbonitrides include silicon oxycarbonitride (SiOCN). Examples of the insulating resins include polyimides, polyesters, and plastic resins. Examples of the semi-conductors include silicon or silicon doped with at least one selected from phosphorus, boron, and germanium.

(Aspect in which Surface of Substrate Includes Two Regions)

For the two regions, a region in which a contact angle of water (preferably, hydrophobicity) tends to be greater than the other region includes a region including at least one selected from the group consisting of Si, SiN, SiOx, TiN, TaN, Ge, and SiGe. For the two regions, a region in which a contact angle of water (preferably, hydrophobicity) tends to be lesser than the other region includes a region including at least one selected from the group consisting of W, Mo, Co, Al, Ni, Ru, Cu, TiN, and TaN.

For example, when one region of the two or more regions is a first region and a region preferably adjacent to the first region is a second region, the first region and the second region have different materials. Herein, each of the first region and the second region may or may not be divided into a plurality of regions. Examples of the first region and the second region include an aspect in which a surface of a substrate itself is a first region and a surface of an inorganic layer formed on the surface of the substrate is a second region, an aspect in which a surface of a first inorganic layer formed on a surface of a substrate is a first region and a surface of a second inorganic layer formed on the surface of the substrate is a second region, and the like. Note that, an aspect in which an organic layer is formed instead of these inorganic layers can also be similarly exemplified. As the aspect in which a surface of a substrate itself is a first region and a surface of an inorganic layer formed on the surface of the substrate is a second region, an aspect in which a surface of at least one substrate selected from the group consisting of a Si substrate, a SiN substrate, a SiOx substrate, a TiN substrate, a TaN substrate, a Ge substrate, and a SiGe substrate is the first region, and a surface of an inorganic layer including at least one selected from the group consisting of W, Mo, Co, Al, Ni, Ru, Cu, TiN and TaN formed on the surface of the substrate is the second region is preferred. Furthermore, as the aspect in which a surface of a first inorganic layer formed on a surface of a substrate is a first region and a surface of a second inorganic layer formed on the surface of the substrate is a second region, an aspect in which the surface of the first inorganic layer including at least one selected from the group consisting of SiN, SiOx, TiN, TaN, Ge, and SiGe formed on a surface of any substrate (for example, a Si substrate) is the first region, and the surface of the second inorganic layer including at least one selected from the group consisting of W, Mo, Co, Al, Ni, Ru, Cu, TiN, and TaN formed on the surface of the substrate is the second region is preferred.

The two regions that the substrate includes preferably include an insulator region and a metal region. In this case, as an aspect of a surface of a substrate consisting of two regions, an aspect in which one region of the two regions is the metal region serving as the first region, and a region preferably adjacent thereto is the insulator region serving as the second region is exemplified. Herein, each of the first region and the second region may or may not be divided into a plurality of regions. Examples of the first region and the second region include an aspect in which a surface of a substrate itself is a metal region serving as the first region and a layer composed of an insulator formed on the surface of the substrate is an insulator region serving as the second region; an aspect in which a surface of a substrate itself is an insulator region serving as the first region and a layer composed of a metal formed on the surface of the substrate is a metal region serving as the second region; an aspect in which a layer composed of a metal formed on a surface of a substrate is a metal region serving as the first region and a layer composed of an insulator formed on the surface of the substrate is an insulator region serving as the second region; and an aspect in which a portion of a surface of a substrate that is an insulator is a metal region serving as the first region and a layer composed of an insulator formed on at least a portion of the surface of the substrate except for the metal region and/or at least a portion of the surface of the substrate except for the metal region (or an entire surface of the substrate except for the metal region) is an insulator region serving as the second region.

(Aspect in which Surface of Substrate Includes Three or More Regions)

When one region of the two or more regions is a first region, a region preferably adjacent to the first region is a second region, and further a region preferably adjacent to the second region is a third region, the first region and the second region have different materials, and the second region and the third region have different materials. Herein, the first region and the third region may or may not have different materials. Furthermore, each of the first region, the second region, and the third region may or may not be divided into a plurality of regions. Examples of the first region, the second region, and the third region include an aspect in which a surface of a substrate itself is the first region, a surface of a first inorganic layer formed on the surface of the substrate is the second region, and a surface of a second inorganic layer formed on the surface of the substrate is the third region, and the like. Note that, an aspect in which an organic layer is formed instead of these inorganic layers can also be similarly exemplified. Furthermore, an aspect including both an inorganic layer and an organic layer in which either one of the first inorganic layer and the second inorganic layer is changed to an organic layer can also be similarly exemplified. An aspect in which a surface of any substrate (e.g., Si substrate) itself is the first region, a surface of a first inorganic layer including at least one selected from the group consisting of SiN, SiOx, TiN, TaN, Ge, and SiGe formed on the surface of the substrate is the second region, and a surface of a second inorganic layer including at least one selected from the group consisting of W, Mo, Co, Al, Ni, Ru, Cu, TiN, and TaN formed on the surface of the substrate is the third region is preferred.

The three or more regions that the substrate includes preferably include at least one insulator region and at least one metal region. In this case, as an aspect of a surfaces of a substrate including three or more regions, an aspect in which one region of the two or more regions is a metal region serving as the first region, a region preferably adjacent to the first region is an insulator region serving as the second region, and a region preferably adjacent to the second insulator region is a metal region serving as the third region; an aspect in which one region of the two or more regions is an insulator region serving as the first region, a region preferably adjacent to the first region is a metal region serving as the second region, and a region preferably adjacent to the second metal region is an insulator region serving as the third region; and an aspect in which one region of the two or more regions is a metal region serving as the first region, a region preferably adjacent to the first region is a metal region serving as the second region, and a region preferably adjacent to the second metal region is an insulator region serving as the third region are exemplified. Herein, the first region and the third region have different materials. Furthermore, each of the first region, the second region, and the third region may or may not be divided into a plurality of regions. Examples of the first region, the second region, and the third region include an aspect in which a surface of a substrate itself is a metal region serving as the first region, a surface of an insulator region preferably adjacent to the substrate and formed on the surface of the substrate is the second region, and a surface of a metal region preferably adjacent to the second region and formed on the surface of the substrate is the third region; and an aspect in which a surface of a substrate itself is an insulator region serving as the first region, a surface of a metal region preferably adjacent to the substrate and formed on the surface of the substrate is the second region, and a surface of an insulator region preferably adjacent to the second region and formed on the surface of the substrate is the third region. The same concept can be applied to the case where a fourth or more regions are present. An upper limit of the number of the regions having different materials is not particularly limited as long as the effect of the present invention is not impaired, but the upper limit is, for example, 7 or less or 6 or less, and typically 5 or less.

<Exposing Step>

In an exposing step, a surface of the substrate prepared in the substrate preparation step is exposed to a surface treatment agent.

(Surface Treatment Agent)

The surface treatment agent for use in the exposing step includes a silylation agent (A) but does not include a nitrogen-containing heterocyclic compound (B). The silylation agent (A) includes organomonosilane and the organomonosilane includes 2 or more and 4 or less nitrogen atoms bonded to a silicon atom. In other words, the silylation agent (A) includes organomonosilane in which 2 or more and 4 or less nitrogen atoms are bonded to a silicon atom. Hereinafter, each component will be described.

[Silylation Agent (A)]

The organomonosilane which is included in the silylation agent (A) and in which 2 or more and 4 or less nitrogen atoms are bonded to a silicon atom means a compound including one silicon atom and 2 or more and 4 or less nitrogen atoms bonded to the silicon atom. It is presumed that, when the organomonosilane including 2 or more and 4 or less nitrogen atoms bonded to a silicon atom is used as the silylation agent (A), the organomonosilane is bonded to the surface of the substrate by exposure to the surface treatment agent in the exposing step and, in a subsequent baking step, the organomonosilane reacts with each other to form a polymer of the organomonosilane on the surface of the substrate. Note that, in the exposing step, the organomonosilane can be bonded to the surface of the substrate, thereby forming a monolayer derived from the organomonosilane on the surface of the substrate. Such a monolayer is preferably a self-assembled monolayer (SAM) in which a network of siloxane bonds is formed in a planar direction of the substrate.

Examples of the organomonosilane which is included in the silylation agent (A) and in which 2 or more and 4 or less nitrogen atoms are bonded to a silicon atom include a compound represented by Formula (1) below:

[Chem. 1]

(1)

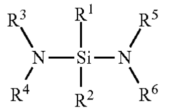

wherein $R^1$ and $R^2$ each independently represents a hydrogen atom, a nitrogen-containing group, or an organic group, and the total number of carbon atoms included in $R^1$ and $R^2$ is 1 or more; and $R^3$ to $R^6$ each independently represents a hydrogen atom, a saturated or unsaturated alkyl group, a saturated or unsaturated cycloalkyl group, an acetyl group, or a saturated or unsaturated hetero-cycloalkyl group.

In Formula (1), $R^3$ to $R^6$ each independently represents a hydrogen atom, a saturated or unsaturated alkyl group, a saturated or unsaturated cycloalkyl group, an acetyl group ($CH_3CO$—), or a saturated or unsaturated hetero-cycloalkyl group. The saturated or unsaturated alkyl group as $R^3$ to $R^6$ is preferably a saturated or unsaturated alkyl group having 1 or more and 10 or less carbon atoms and specific examples thereof include a methyl group, an ethyl group, an n-propyl group, an isopropyl group, an n-butyl group, an isobutyl group, a sec-butyl group, a tert-butyl group, a vinyl group, an aryl group, and the like. The saturated or unsaturated cycloalkyl group as $R^3$ to $R^6$ is preferably a saturated or unsaturated cycloalkyl group having 3 or more and 10 or less carbon atoms and specific examples thereof include a cyclobutyl group, a cyclopentyl group, a cyclohexyl group, and the like. Examples of the saturated or unsaturated hetero-cycloalkyl group as $R^3$ to $R^6$ include a piperidino group, a morpholino group, and the like.

In Formula (1), $R^1$ and $R^2$ each independently represents a hydrogen atom, a nitrogen-containing group, or an organic group, and the total number of carbon atoms included in $R^1$ and $R^2$ is 1 or more. Examples of the nitrogen-containing group as $R^1$ and $R^2$ include —$NR^7R^8$, and the like. $R^7$ and $R^8$ each independently represents a hydrogen atom, a saturated or unsaturated alkyl group, a saturated or unsaturated cycloalkyl group, an acetyl group, or a saturated or unsaturated hetero-cycloalkyl group. The saturated or unsaturated alkyl group, the saturated or unsaturated cycloalkyl group, and the saturated or unsaturated hetero-cycloalkyl group as $R^7$ and $R^8$ are the same as the groups described above for $R^3$ to $R^6$. Examples of the organic group as $R^1$ and $R^2$ include a saturated or unsaturated alkyl group in which a part or all of hydrogen atoms may be substituted with a fluorine atom(s), an aromatic hydrocarbon group in which a part or all of hydrogen atoms may be substituted with a fluorine atom(s), and the like. The saturated or unsaturated alkyl group as $R^1$ and $R^2$ is the same as the saturated or unsaturated alkyl group as described above for $R^3$ to $R^6$. Examples of the aromatic hydrocarbon group as $R^1$ and $R^2$ include a phenyl group, a naphthyl group, and the like. The total number of carbon atoms included in $R^1$ and $R^2$ is preferably 20 or less.

Specific examples of the compound represented by Formula (1) include compounds represented by Formulae below.

[Chem. 2]

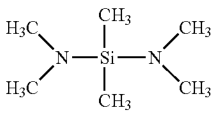

BDMADMS

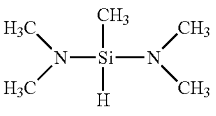

BDMAMS

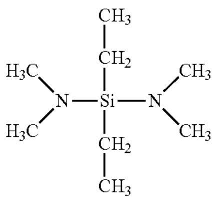

BDMADES

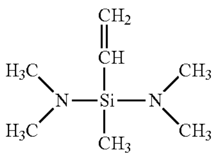

BDMAVMS

-continued

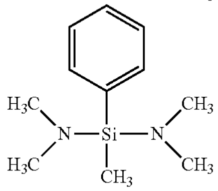

BDMAPMS

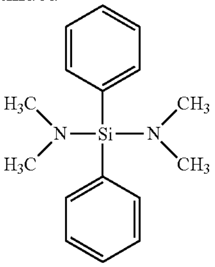

BDMADPS

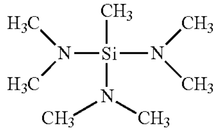

TDMAMS

The silylation agent (A) may include one, two, or more types of the organomonosilane in which 2 or more and 4 or less nitrogen atoms are bonded to a silicon atom and may include one, two, or more types of the compound represented by Formula (1). Note that, the silylation agent (A) may include another silylation agent other than the organomonosilane in which 2 or more and 4 or less nitrogen atoms are bonded to a silicon atom, but preferably does not include the other silylation agent other than the organomonosilane in which 2 or more and 4 or less nitrogen atoms are bonded to a silicon atom.

An amount of the organomonosilane in which 2 or more and 4 or less nitrogen atoms are bonded to a silicon atom contained in the surface treatment agent is not particularly limited as long as the effect of the present invention is not impaired, but is preferably 0.01% by mass or more, more preferably 0.1% by mass or more, further preferably 1.0% by mass or more, and particularly preferably 10% by mass or more relative to a total amount of the surface treatment agent. An upper limit value of the amount of the organomonosilane in which 2 or more and 4 or less nitrogen atoms are bonded to a silicon atom contained in the surface treatment agent is not particularly limited as long as the effect of the present invention is not impaired, but is, for example, 100% by mass or less, 90% by mass or less, or 80% by mass or less.

[Nitrogen-Containing Heterocyclic Compound (B)]

The surface treatment agent does not include a nitrogen-containing heterocyclic compound (B). The nitrogen-containing heterocyclic compound (B) is a compound including a nitrogen atom in a cyclic structure thereof. In the present aspect, a film composed of a high molecular weight condensate (polymer) of the silylation agent (A) (e.g., a thick film composed of a condensate of the silylation agent (A)) can be formed on a surface of a substrate and a modification degree of water repellency or an inhibiting effect for film formation by the ALD method can be changed depending on materials of the surface of the substrate by exposing the surface of the substrate to a surface treatment agent including a specific silylation agent (A) and not including the nitrogen-containing heterocyclic compound (B) and then baking the substrate without rinsing.

[Solvent (S)]

The surface treatment agent may include a solvent or may not substantially include a solvent. From the viewpoint of easiness of the surface treatment of the substrate by means of a dipping method, a spin coating method, and the like, the surface treatment agent preferably includes the solvent. Note that, the phrase "the surface treatment agent may not substantially include a solvent" means that an amount of the solvent contained in the surface treatment agent is 5% by mass or less, preferably 1% by mass or less, and more preferably 0.1% by mass or less. When the surface treatment agent includes the solvent, the solvent may be blended in an amount appropriately adjusted within a range of, for example, 0.1% by mass or more and 99.99% by mass or less, and the amount of the solvent may be equal to an amount determined by subtracting an amount of the silylation agent (A) from that of the surface treatment agent.

Specific examples of the solvent include sulfoxides such as dimethylsulfoxide;

- sulfones such as dimethylsulfone, diethylsulfone, bis(2-hydroxyethyl)sulfone, and tetramethylene sulfone;
- amides such as N,N-dimethylformamide, N-methylformamide, N,N-dimethylacetamide, N-methylacetamide, and N,N-dimethylacetamide;
- imidazolidinones such as 1,3-dimethyl-2-imidazolidinone, 1,3-diethyl-2-imidazolidinone, and 1,3-diisopropyl-2-imidazolidinone;
- dialkyl glycol ethers such as dimethyl glycol, dimethyl diglycol, dimethyl triglycol, methylethyl diglycol, diethyl glycol, and triethylene glycol butyl methyl ether;
- monoalcohol-based solvents such as methanol, ethanol, n-propanol, isopropanol, n-butanol, isobutanol, sec-butanol, tert-butanol, n-pentanol, isopentanol, 2-methyl butanol, sec-pentanol, tert-pentanol, 3-methoxybutanol, 3-methyl-3-methoxybutanol, n-hexanol, 2-methyl pentanol, sec-hexanol, 2-ethyl butanol, sec-heptanol, 3-heptanol, n-octanol, 2-ethyl hexanol, sec-octanol, n-nonyl alcohol, 2,6-dimethyl-4-heptanol, n-decanol, sec-undecyl alcohol, trimethyl nonyl alcohol, sec-tetradecyl alcohol, sec-heptadecyl alcohol, methyl isobutyl carbinol, phenol, cyclohexanol, methyl cyclohexanol, 3,3,5-trimethyl cyclohexanol, benzyl alcohol, phenyl methyl carbinol, diacetone alcohol, and cresol;
- (poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether;
- (poly)alkylene glycol monoalkyl ether acetates such as ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, propylene glycol monomethyl ether acetate, and propylene glycol monoethyl ether acetate;
- other ethers such as dimethyl ether, diethyl ether, methylethyl ether, dipropyl ether, diisopropyl ether, dibutyl ether, diisoamyl ether, diethylene glycol dimethyl ether, diethylene glycol methylethyl ether, diethylene glycol monobutyl ether, diethylene glycol diethyl ether, tetraethylene glycol dimethyl ether, and tetrahydrofuran;
- ketones such as methyl ethyl ketone, cyclohexanone, 2-heptanone, and 3-heptanone;
- alkyl lactate esters such as methyl 2-hydroxypropionate and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxy-1-butyl acetate, 3-methyl-3-methoxybutyl propionate, ethyl acetate, n-propyl acetate, i-propyl acetate, n-butyl acetate, i-butyl acetate, n-pentyl acetate, n-hexyl acetate, n-heptyl acetate, n-octyl acetate, n-pentyl formate, i-pentyl acetate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, and propylene glycol diacetate;
- lactones such as β-propiolactone, γ-butyrolactone, and δ-pentyrolactone;
- linear, branched, or cyclic aliphatic hydrocarbons such as n-hexane, n-heptane, n-octane, n-nonane, methyloctane, n-decane, n-undecane, n-dodecane, 2,2,4,6,6-pentamethyl heptane, 2,2,4,4,6,8,8-heptamethyl nonane, cyclohexane, and methyl cyclohexane;
- aromatic hydrocarbons such as benzene, toluene, benzotrifluoride, xylene, 1,3,5-trimethyl benzene, naphthalene, and decahydronaphthalene;
- terpenes such as p-menthane, diphenyl menthane, limonene, terpinene, bornane, norbornane, and pinane;
- amines such as diisopropylamine, ethylenediamine, and diethylenetriamine; and the like. These solvents can be used alone or by mixing two or more thereof. Among them, the solvent preferably includes alkylene glycol monoalkyl ether acetate.

The surface treatment agent can be produced by mixing components.

(Exposing Method)

As a method for exposing the surface of a substrate to a surface treatment agent, a method in which a surface treatment agent (typically, liquid surface treatment agent) that may or may not include a solvent is applied to (for example, coated onto) the surface of the substrate by means of a dipping method, or a coating method such as a spin coating method, a roll coating method, and a doctor blading method; and a method in which vapor of the surface treatment agent is applied to the surface of the substrate are exemplified. The method for exposing a surface of a substrate to a surface treatment agent is preferably a spin coating method. An exposure temperature is, for example, 10° C. or more and 40° C. or less, preferably 15° C. or more and 35° C. or less, and more preferably 20° C. or more and 30° C. or less. An exposure time is preferably 10 seconds or more, and more preferably 30 seconds or more. An upper limit of the exposure time is not particularly limited, but is, for example, 10 minutes or less and typically 5 minutes or less.

<Baking Step>

In a baking step, a substrate is baked (heated) after the exposing step. The baking allows the organomonosilane which is included in the surface treatment agent and in which 2 or more and 4 or less nitrogen atoms are bonded to a silicon atom to react with each other, thereby forming a polymer of the organomonosilane on the surface of the substrate. In the present aspect, a rinsing step of rinsing the surface of the substrate with a liquid is not included between the exposing step and the baking step.

A baking temperature is preferably 140° C. or more and 500° C. or less and more preferably 150° C. or more and 400° C. or less. Furthermore, a baking time is preferably 0.5 minutes or more and 50 minutes or less and more preferably 1 minute or more and 30 minutes or less.

Thus, a film composed of a high molecular weight condensate of the silylation agent (A) can be formed on the surface of the substrate and a modification degree (degree of rendering the film water repellent or inhibiting film formation by the ALD method) can be changed depending on materials of the surface of the substrate as described in Examples as described below by exposing the surface of the substrate to the surface treatment agent including organomonosilane in which 2 or more and 4 or less nitrogen atoms are bonded to a silicon atom as the silylation agent and not including the nitrogen-containing heterocyclic compound (B) and then baking the substrate without rinsing. A mechanism by which the film composed of a high molecular weight condensate of the silylation agent (A) can be formed on the surface of the substrate and a modification degree can be changed depending on materials of the surface of the substrate is unknown, but is presumed to be as follows. The organomonosilane in which 2 or more and 4 or less nitrogen atoms are bonded to a silicon atom is bonded to the surface of the substrate by exposure to the surface treatment agent in the exposing step and, in a subsequent baking step, the organomonosilane reacts with each other without inhibition by the nitrogen-containing heterocyclic compound (B). Thus, a high molecular weight polymer (condensate of the silylation agent) of the organomonosilane bonded on the surface of the substrate is formed. A degree of formation of the polymer of the organomonosilane bonded on the surface of the substrate depends on materials of the substrate and therefore a substrate having a plurality of regions can be modified (for example, imparted with hydrophobicity or an inhibiting effect for film formation by the ALD method) at modification degrees that are different depending on materials of the regions on a surface of the substrate.

On the other hand, in the case where the nitrogen-containing heterocyclic compound (B) is included, in the case where the substrate is not baked after the surface of the substrate is exposed to the surface treatment agent, or in the case where the substrate is rinsed after the surface of the substrate is exposed to the surface treatment agent but before the substrate is baked, the molecular weight of the film to be formed on the surface of the substrate is not sufficiently high enough and it is difficult to modify a substrate having a plurality of regions (for example, imparted with hydrophobicity or an inhibiting effect for film formation by the ALD method) at modification degrees that are different depending on materials of the regions on a surface of the substrate. Also, in the case where the silylation agent is not the organomonosilane in which 2 or more and 4 or less nitrogen atoms are bonded to a silicon atom, the molecular weight of the film to be formed on the surface of the substrate is not sufficiently high enough and it is difficult to impart a substrate having a plurality of regions with an inhibiting effect for film formation by the ALD method, for example, depending on materials of the regions on a surface of the substrate.

After the baking step, rinsing (cleaning) with a liquid, for example, rinsing with water, an active agent, or the like and drying by nitrogen blowing or the like may be carried out, if necessary.

A contact angle of water on the surface of the substrate after the surface treatment according to the present aspect can be, for example, 85° or more and 140° or less. In the present aspect, the surface treatment allows contact angles of water to be different from each other in the two or more regions, enabling selective improvement of water repellency (hydrophobicity) between the two or more regions. A difference in contact angle of water between the two or more regions is not particularly limited as long as the effect of the present invention is not impaired, and is, for example, 50° or more or may be 70° or more, 80° or more, or 90° or more. An upper limit of the difference in contact angle is not particularly limited as long as the effect of the present invention is not impaired, and is, for example, 120° or less or 100° or less.

When a film is formed on a surface of a substrate that has been surface-treated (modified) according to the present aspect by the ALD method, a thickness of the thus-formed film is, for example, 6.0 nm or less, or may be 5.0 nm or less, 3.0 nm or less, 2.0 nm or less, 1.0 nm or less, or 0.62 nm or less. In the present aspect, when a film is formed by the ALD method on a surface of a substrate that has been surface-treated (modified) according to the present aspect, the two or more regions can have different inhibiting effects for film formation by the ALD method from each other, enabling improvement of region-selectivity in film formation by the ALD method (ALD selectivity) between the two or more regions. A difference in thickness of the film formed by the ALD method between two or more regions is not particularly limited as long as the effect of the present invention is not impaired, and is, for example, 2.0 nm or more or may be 3.0 nm or more. An upper limit of the difference in thickness of the film formed by the ALD method is not particularly limited as long as the effect of the present invention is not impaired, and is, for example, 4.5 nm or less.

<<Method for Region-Selectively Producing Film on Surface of Substrate>>

Next, a method for region-selectively producing a film on a substrate using the method for treating a surface according to the first aspect will be described. In this aspect, the method for region-selectively producing a film on a surface of a substrate includes treating the surface of the substrate by the method for treating a surface according to the first aspect; and forming a film by an atomic layer deposition (ALD) method on the surface of the substrate having been surface-treated, a material of the film being deposited in region-selectively different amounts.

The surface treatment according to the first aspect results in different contact angles of water (preferably, hydrophobicity) between the two or more regions. Thus, in this aspect, a material for forming the film (film-forming material) can be deposited in region-selectively different amounts between the two or more regions on the surface of the substrate. Specifically, it is preferable that the film-forming material is not easily adsorbed (preferably, chemically adsorbed) by the ALD method in a region in which the contact angle of water (preferably, hydrophobicity) is greater than that of the other region(s) in the two or more regions and thus the film-forming material is deposited in different amounts between the two or more regions, resulting in the film-forming material deposited in region-selectively different amounts on the substrate. Examples of the chemical adsorption include chemical adsorption to a hydroxyl group, and the like.

As a region in which a contact angle of water (preferably, hydrophobicity) tends to be greater than the other region(s) in the two or more regions, a region including at least one selected from the group consisting of Si, SiN, SiOx, TiN, TaN, Ge, and SiGe is exemplified. As a region in which a contact angle of water (preferably, hydrophobicity) tends to be lesser than the other region(s) in the two or more regions, a region including at least one selected from the group consisting of W, Mo, Co, Al, Ni, Ru, Cu, TiN, and TaN is exemplified.

Herein, as shown in the below-mentioned Examples and Comparative Examples, even though the contact angles of water are similar to each other in the two or more regions, deposition amounts of the film-forming material by the ALD method may be greatly different. Therefore, it is believed that there is a factor affecting the deposition amount of the film-forming material by the ALD method other than the contact angle of water in the two or more regions and the factor is a molecular weight of the film formed on the surface of the substrate. The method for treating a surface according to the first aspect results in a film having a high molecular weight formed on the surface of the substrate and therefore it is presumed that the method exhibits extremely excellent region-selectivity in film production by the ALD method on the surface of the substrate which has been modified (surface-treated).

(Film Formation by ALD Method)

A method for forming a film by the ALD method is not particularly limited, but is preferably a method for forming a thin-film by adsorption (preferably, chemical adsorption) using at least two gas-phase reactants (hereinafter, also simply referred to as a "precursor gas"). Specific examples of the method include a method including the following steps (a) and (b), and repeating the following steps (a) and (b) at least once (one cycle) until a desired film thickness is obtained:

(a) a step of exposing a substrate that has been surface-treated by the method according to the first aspect to a pulse of a first precursor gas, and (b) a step of exposing the substrate to a pulse of a second precursor gas, subsequent to the step (a).

After the step (a) but before the step (b), a plasma treatment step, and a step of removing or discharging (purging) the first precursor gas and a reacted product thereof with a carrier gas, the second precursor gas, and the like, may be or may not be included. After the step (b), a plasma treatment step, and a step of removing or purging the second precursor gas and a reacted product thereof with a carrier gas, and the like, may be or may not be included. Examples of the carrier gas include inert gas such as nitrogen gas, argon gas, and helium gas.

Pulse for each cycle and each formed layer are preferably self-controlling, and more preferably each formed layer is a mono-atomic layer. A thickness of the mono-atomic layer can be, for example, 5 nm or less, preferably 3 nm or less, more preferably 1 nm or less, and further preferably 0.5 nm or less.

As the first precursor gas, an organic metal, a metal halide, a metal oxyhalide, and the like are exemplified. Specific examples thereof include tantalum pentaethoxide, tetrakis (dimethylamino)titanium, pentakis(dimethylamino)tantalum, tetrakis(dimethylamino)zirconium, tetrakis (dimethylamino) hafnium, tetrakis(dimethylamino)silane, copper hexafluoroacetyl acetonate vinyltrimethylsilane, $Zn(C_2H_5)_2$, $Zn(C_2H_5)_2$, $Zn(CH_3)_2$, TMA (trimethyl aluminum), $TaCl_5$, $WF_6$, $WOCl_4$, CuCl, $ZrCl_4$, $AiCl_3$, $TiCl_4$, $SiCl_4$, $HfCl_4$, and the like.

As the second precursor gas, a precursor gas capable of decomposing the first precursor or a precursor gas capable of removing a ligand of the first precursor is exemplified, and specific examples thereof include $H_2O$, $H_2O_2$, $O_2$, $O_3$, $NH_3$, $H_2S$, $H_2Se$, $PH_3$, $AsH_3$, $C_2H_4$, or $Si_2H_6$.

An exposure temperature in the step (a) is not particularly limited, but is, for example, 100° C. or more and 800° C. or less, preferably 150° C. or more and 650° C. or less, more preferably 200° C. or more and 500° C. or less, and further preferably 225° C. or more and 375° C. or less.

An exposure temperature in the step (b) is not particularly limited, but may be substantially equal to or more than the exposure temperature in the step (a).

The film formed by the ALD method is not particularly limited. Examples thereof include a film containing a pure element (e.g., Si, Cu, Ta, W), a film containing an oxide (e.g., $SiO_2$, $GeO_2$, $HfO_2$, $ZrO_2$, $Ta_2O_5$ $TiO_2$, $Al_2O_3$, ZnO, $SnO_2$, $Sb_2O_5$, $B_2O_3$, $In_2O_3$, $WO_3$), a film containing a nitride (e.g., $Si_3N_4$, TiN, AlN, BN, GaN, and NbN), a film containing a carbide (e.g., SiC), a film containing a sulfide (e.g., CdS, ZnS, MnS, $WS_2$, and PbS), a film including a selenide (e.g., CdSe and ZnSe), a film containing a phosphide (GaP and InP), a film containing an arsenide (e.g., GaAs and InAs), or a mixture thereof.

EXAMPLES

Hereinafter, the present invention will be described more specifically with reference to Examples, but the scope of the present invention is not limited to these Examples.

(Measurement of Film Thickness Formed by Surface Treatment)

Example 1

(Preparation of Surface Treatment Agent)

One-hundred percent by mass of bis(dimethylamino)dimethylsilane (BDMADMS) was used as a surface treatment agent of Example 1.

(Surface Treatment and Measurement of Thickness of Surface-Treated Film)

A silicon thermal oxide film substrate (SiOx) was surface treated using the resultant surface treatment agent of Example 1 according to the following method. Specifically, at room temperature (25° C.), a surface of the substrate which had been measured for thickness with a fluorescent X-ray analysis was coated with (exposed to) the surface treatment agent by a spin coating method (1500 rpm, 0.5 min) and then spin-dried (1000 rpm, 0.5 min). Next, the thus spin-dried substrate was placed in a heating furnace and heated (baked) at 300° C. for 1 minute. Then, the thus-baked substrate was cleaned (rinsed) for 1 minute by adding isopropanol dropwise onto the substrate while rotating, then cleaned (rinsed) for 1 minute by adding ion-exchanged distilled water dropwise thereon, and directly spin-dried. The substrate was cleaned at room temperature. Note that, the substrate was not rinsed with a liquid between the coating with (exposure to) the surface treatment agent of the substrate and the baking. The substrate that had been cleaned and spin-dried was measured for overall thickness with a fluorescent X-ray analysis and a difference from an initial thickness of the substrate was calculated, which was determined to be 0.96 nm. In other words, a film thickness of the film formed on the surface of the substrate by the surface treatment (surface-treated film thickness) was 0.96 nm.

Comparative Example 1

A substrate was surface-treated and measured for the surface-treated film thickness in the same manner as in Example 1, except that a surface treatment agent prepared by uniformly mixing BDMADMS and imidazole at a mass ratio of 5:3.5 was used, and the difference between the overall thickness of the substrate that had been cleaned and spin-dried and the initial thickness of the substrate was 0.84 nm.

Comparative Example 2

A substrate was surface-treated and measured for the surface-treated film thickness in the same manner as in Example 1, except that tetramethyldisilazane (TMDS) was used instead of BDMADMS, and the difference between the overall thickness of the substrate that had been washed and spin-dried and the initial thickness of the substrate was 0.10 nm.

The results from Example 1 and Comparative Examples 1 to 2 demonstrate that Example 1, which had been exposed to the surface treatment agent including organomonosilane in which 2 or more and 4 or less nitrogen atoms are bonded to a silicon atom serving as the silylation agent (A) and not including imidazole serving as the nitrogen-containing heterocyclic compound (B) and then baked, formed a thicker film by the surface treatment than those of Comparative Example 1 including imidazole serving as the nitrogen-containing heterocyclic compound (B) and Comparative Example 2 including TMDS serving as the silylation agent. Therefore, it can be said that the film derived from the silylation agent (A) in Example 1 has a higher molecular weight than those of Comparative Examples 1 and 2.

Example 2

(Preparation of Surface Treatment Agent)

Bis(dimethylamino)dimethylsilane (BDMADMS) serving as the silylation agent (A) was added to propylene glycol monomethyl ether acetate (S1) serving as the solvent so as to give a concentration of 10% by mass and uniformly mixed together, thereby preparing a surface treatment agent of Example 2.

(Surface Treatment)

A silicon thermal oxide film substrate ($SiO_x$), a tungsten substrate (W), and a molybdenum substrate (Mo) were surface treated using the resultant surface treatment agent of Example 2 according to the following method. Specifically, at room temperature (25° C.), a surface of each of the substrates was coated with (exposed to) the surface treatment agent by a spin coating method (1500 rpm, 0.5 min) and then spin-dried (1000 rpm, 0.5 min). Next, the thus spin-dried substrate was placed in a heating furnace and heated (baked) at 300° C. for 1 minute. Then, the thus-baked substrate was cleaned (rinsed) for 1 minute by adding isopropanol dropwise onto the substrate while rotating, and then cleaned (rinsed) for 1 minute by adding ion-exchanged distilled water dropwise thereon. The substrate was cleaned at room temperature. Note that, the substrate was not rinsed with a liquid between the coating with (exposure to) the surface treatment agent of the substrate and the baking.

Comparative Example 3

A substrate that had been surface-treated was obtained in the same manner as in Example 2, except that tetramethyldisilazane (TMDS) was used instead of bis(dimethylamino) dimethylsilane (BDMADMS) as the silylation agent (A).

Comparative Example 4

A silicon thermal oxide film substrate ($SiO_x$), a tungsten substrate (W), and a molybdenum substrate (Mo) which had not been surface-treated were used as substrates of Comparative Example 4.

<Measurement of Contact Angle of Water>

The surface-treated substrates obtained from Example 2 and Comparative Example 3 and the substrates of Comparative Example 4 were measured for a contact angle of water. The contact angle of water was measured by dropping droplets (2.0 μL) of pure water on a surface of each of the substrates and measuring a contact angle at 2 seconds after dropping using Dropmaster 700 (manufactured by Kyowa Interface Science Co., Ltd.). The results are shown in Table 1.

<ALD Film Formation Test of $Al_2O_3$>

A surface of each of the surface-treated substrates obtained from Example 2 and Comparative Example 3 and the substrates of Comparative Example 4 was subjected to an ALD cycle process 45 times under the following conditions, thereby forming an $Al_2O_3$ film. The thus-formed $Al_2O_3$ film was measured for film thickness with a fluorescent X-ray analysis. The results are shown in Table 1.

Atomic layer deposition (ALD) device: AT-410 (manufactured by Anric Technologies)

Chamber temperature: 150° C.

Precursor: trimethylaluminum and $H_2O$

TABLE 1

| | Silylation agent (A) | Nitrogen-containing heterocyclic compound (B) | Contact angle of water (°) | | | Film thickness of $Al_2O_3$ (nm) | | |
|---|---|---|---|---|---|---|---|---|
| | | | SiOx | W | Mo | SiOx | W | Mo |
| Example 2 | BDMADMS | No | 101.8 | 8.8 | 9.0 | 1.397 | 4.694 | 5.704 |
| Comparative Example 3 | TMDS | No | 100.4 | 5.1 | 5.4 | 3.244 | 4.823 | 5.510 |
| Comparative Example 4 | — | — | 33.8 | 11.8 | 14.1 | 4.720 | 4.566 | 5.404 |

As is clear from the results shown in Table 1 above, an insulator substrate ($SiO_x$) was rendered water repellent, but metal substrates (W, Wo) were not rendered water repellent in both of Example 2 which had been exposed to the surface treatment agent including, as the silylation agent (A), organomonosilane in which 2 or more and 4 or less nitrogen atoms were bonded to a silicon atom and not including the nitrogen-containing heterocyclic compound (B), and then baked and Comparative Example 3 which had been exposed to the surface treatment agent including, as the silylation agent (A), organodisilane in which only one nitrogen atom was bonded to a silicon atom rather than the organomonosilane in which 2 or more and 4 or less nitrogen atoms were bonded to a silicon atom, and then baked. Therefore, the insulator substrate ($SiO_x$) and the metal substrates (W, Wo) had greatly different contact angles of water from each other. Note that, a degree of water-repellency (contact angle) of the insulator substrate ($SiO_x$) was comparable between Example 2 and Comparative Example 3. Therefore, it can be said that Example 2 and Comparative Example 3 can selectively render the insulator substrate ($SiO_x$) water repellent compared to the metal substrates (W, Wo).

On the other hand, a film having a film thickness of 5 nm should be formed after 45 cycles of ALD in the ALD film formation test, but, for Example 2, an $Al_2O_3$ film having a film thickness of about 1.4 nm was formed on the insulator substrate ($SiO_x$), which was less than half of that of Comparative Example 3. Therefore, it can be said that Example 2 significantly inhibited ALD film formation on the insulator substrate ($SiO_x$) compared to Comparative Example 3. In the ALD film formation test, ALD film formation on the metal substrates (W, Wo) was hardly inhibited in Example 2 and Comparative Example 3. Therefore, it can be said that Example 2 can selectively inhibit the ALD film formation on the insulator substrate ($SiO_x$) compared to the metal substrates (W, Wo) to a greater extent than Comparative Example 3 which is comparable with Example 2 with respect to water repellency. It is presumed that this is because the film derived from the silylation agent (A) in Example 2 had a higher molecular weight than that of Comparative Example 3 which used TMDS, as is the case where the film derived from the silylation agent (A) in Example 1 had a higher molecular weight than that of Comparative Example 2 which used TMDS.

Examples 3 to 10

Surface treatment agents were prepared and surface treatment was performed in the same manner as in Example 2, except that S2 to S9 as described below were used instead of propylene glycol monomethyl ether acetate (S1) as the solvent. The solvents used are shown in Table 2.

S2: Methyl ethyl ketone
S3: Diisopropylether
S4: Cyclohexane
S5: n-Decane
S6: Diisopropylamine
S7: Dimethylformamide
S8: Ethylenediamine
S9: Diethylenetriamine The surface-treated substrates obtained from Examples 3 to 10 were subjected to <Measurement of contact angle of water> in the same manner as in Example 2. The results from Examples 3 to 10 are shown in Table 2 along with the results from Example 2 and Comparative Example 4. Note that, the metal substrates (W, Wo) were not rendered water repellent in each case.

TABLE 2

| | Solvent | Contact angle of water (°) $SiO_x$ |
|---|---|---|
| Example 2 | S1 | 101.8 |
| Example 3 | S2 | 87.1 |
| Example 4 | S3 | 97.8 |
| Example 5 | S4 | 82.4 |
| Example 6 | S5 | 86.8 |
| Example 7 | S6 | 97.9 |
| Example 8 | S7 | 94.5 |
| Example 9 | S8 | 88.2 |
| Example 10 | S9 | 91.2 |
| Comparative Example 4 | — | 33.8 |

As is clear from the results shown in Table 2 above, Examples 3 to 10 which used the S2 to S9 instead of the S1 as the solvent rendered the insulator substrate ($SiO_x$) water repellent, but did not render the metal substrates (W, Wo) water repellent, as is the case for Example 2 which used the S1. Therefore, it can be said that the insulator substrate ($SiO_x$) can be selectively rendered water repellent compared to the metal substrates (W, Wo).

It is presumed that Examples 3 to 10 which used the S2 to S9 instead of the S1 as the solvent significantly inhibit ALD film formation on the insulator substrate ($SiO_x$) in the ALD film formation test, but do not inhibit ALD film formation on the metal substrates (W, Wo), as is the case for Example 2 which used the S1, and the ALD film formation can be selectively inhibited on the insulator substrate ($SiO_x$) compared to the metal substrates (W, Wo), which is possibly because the film derived from the silylation agent (A) have a high molecular weight as is the case for Example 1.

Examples 11 to 17

(Surface Treatment)

A silicon thermal oxide film substrate ($SiO_x$), a tungsten substrate (W), and a molybdenum substrate (Mo) were surface treated using the surface treatment agent of Example 2 according to the following method. Specifically, the substrates were dipped in (exposed to) the surface treatment agent at room temperature (25° C.) for 1 minute, removed, and then dried with a nitrogen stream. Next, the substrates which had been dried with a nitrogen stream were placed in a heating furnace and heated (baked) at temperatures for periods of time as described in Table 3. Then, the thus-baked substrates were cleaned (rinsed) by dipping them in isopropanol and stirring for one minute, and then cleaned (rinsed) with ion-exchanged distilled water for one minute. The substrates were cleaned at room temperature. Note that, the substrates were not rinsed with a liquid between the coating with (exposure to) the surface treatment agent of the substrate and the baking. The thus-cleaned substrates were dried with nitrogen flow, thereby obtaining surface-treated substrates.

Comparative Example 5

A substrate was surface-treated in the same manner as in the above-mentioned surface treatment, except that the baking was not performed. The thus-obtained substrate was used as a substrate of Comparative Example 5.

The surface-treated substrates obtained from Examples 11 to 17 and Comparative Example 5 were subjected to <Measurement of contact angle of water> in the same manner as in Example 2. The results are shown in Table 3. Note that, the metal substrates (W, Wo) were not rendered water repellent in each case.

TABLE 3

| | Baking temperature (° C.) | Baking time (minute (s)) | Contact angle of water (°) $SiO_x$ |
|---|---|---|---|
| Example 11 | 150 | 1 | 96.7 |
| Example 12 | 150 | 30 | 100.5 |
| Example 13 | 200 | 1 | 95.5 |
| Example 14 | 200 | 30 | 100.5 |
| Example 15 | 300 | 1 | 103.2 |
| Example 16 | 350 | 1 | 104.1 |
| Example 17 | 400 | 1 | 105.3 |
| Comparative Example 5 | — | 1 | 88.0 |

As is clear from the results shown in Table 3 above, even though the above baking condition was changed to baking temperatures of 150° C. or more and 400° C. or less and baking times of 1 minute or more and 30 minutes or less, the insulator substrate ($SiO_x$) was rendered water repellent, but the metal substrates (W, Wo) were not rendered water repellent, as is the case for Example 2. Therefore, it can be said that the insulator substrate ($SiO_x$) can be selectively rendered water repellent compared to the metal substrates (W, Wo). Even though the above baking condition was changed to baking temperatures of 150° C. or more and 400° C. or less and baking times of 1 minute or more and 30 minutes or less, it is presumed that the ALD film formation on the insulator substrate ($SiO_x$) are significantly inhibited in the ALD film formation test, but the ALD film formation on the metal substrates (W, Wo) are not inhibited, as is the case for Example 2, and the ALD film formation can be selectively inhibited on the insulator substrate ($SiO_x$) compared to the metal substrates (W, Wo), which is possibly because the film derived from the silylation agent (A) have a high molecular weight as is the case for Example 1.

Examples 18 to 25

Surface treatment agents were prepared and surface treatment was performed in the same manner as in Example 2, except that concentrations (% by mass) of bis(dimethylamino)dimethylsilane(BDMADMS) serving as the silylation agent (A) in the surface treatment agents was as described in Table 4. Note that, for Example 25 in which the concentration of bis(dimethylamino)dimethylsilane (BDMADMS) was 100% by mass, a surface treatment agent consisting of bis(dimethylamino)dimethylsilane and not including a solvent was used.

Comparative Example 6

A surface treatment agent was prepared and surface treatment was performed in the same manner as in Example 25, except that the baking was not performed.

The surface-treated substrates obtained from Examples 18 to 25 and Comparative Example 6 were subjected to <Measurement of contact angle of water> in the same manner as in Example 1. The results from Examples 18 to 25 and Comparative Example 6 are shown in Table 4 along with the results from Comparative Example 4. Note that, the metal substrates (W, Wo) were not rendered water repellent in each case.

TABLE 4

| | Concentration of silylation agent (A) (% by mass) | Baking | Contact angle of water (°) $SiO_x$ |
|---|---|---|---|
| Example 18 | 0.6 | Yes | 85.4 |
| Example 19 | 5.0 | Yes | 94.5 |
| Example 20 | 10.0 | Yes | 102.2 |
| Example 21 | 20.0 | Yes | 103.6 |
| Example 22 | 40.0 | Yes | 104.5 |
| Example 23 | 60.0 | Yes | 104.6 |
| Example 24 | 80.0 | Yes | 104.4 |
| Example 25 | 100.0 | Yes | 104.8 |
| Comparative Example 6 | 100.0 | No | 88.0 |
| Comparative Example 4 | — | — | 33.8 |

As is clear from the results shown in Table 4 above, even though the concentration of the silylation agent was changed to 10.0% by mass or more and 100% by mass or less, the insulator substrate ($SiO_x$) was rendered water repellent, but the metal substrates (W, Wo) were not rendered water repellent, as is the case for Example 2. Therefore, it can be said that the insulator substrate ($SiO_x$) can be selectively rendered water repellent compared to the metal substrates (W, Wo). It can be said that, when the concentration of the silylation agent is 0.6% or more, the substrate can be rendered water repellent to the same or greater extent than the case where the concentration of the silylation agent was 100% by mass and the baking was not performed. Even though the concentration of the silylation agent was changed to 0.6% by mass or more and 100% by mass or less, it is presumed that the ALD film formation on the insulator substrate ($SiO_x$) are significantly inhibited in the ALD film formation test, but the ALD film formation on the metal substrates (W, Wo) are not inhibited, as is the case for Example 2, and the ALD film formation can be selectively inhibited on the insulator substrate ($SiO_x$) compared to the metal substrates (W, Wo), which is possibly because the film derived from the silylation agent (A) have a high molecular weight as is the case for Example 1.

Examples 26 to 32

Substrates that had been surface-treated were obtained in the same manner as in Example 12, except that the following silylation agents were used instead of bis(dimethylamino) dimethylsilane(BDMADMS) as the silylation agent (A). The silylation agents used are shown in Table 5.

[Chem. 3]

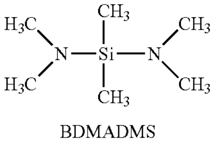

BDMADMS

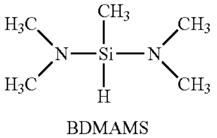

BDMAMS

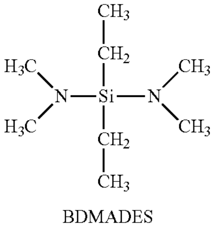

BDMADES

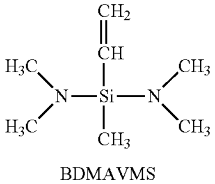

BDMAVMS

-continued

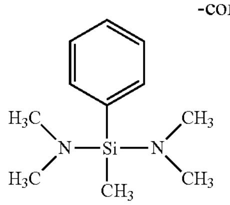

BDMAPMS

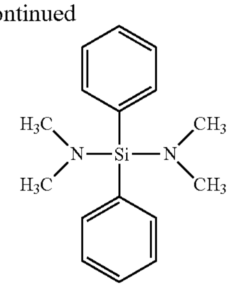

BDMADPS

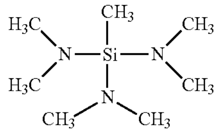

TDMAMS

Comparative Examples 7 to 13

A substrate that had been surface-treated was obtained in the same manner as in Examples 26 to 32, except that the baking was not performed.

Comparative Example 14

A substrate was treated in the same manner as Examples 26 to 32, except that the surface treatment agent was not used. The thus-treated substrate was used as a substrate of Comparative Example 12.

Comparative Example 15

A substrate that had been surface-treated was obtained in the same manner as in Comparative Example 14, except that the baking was not performed.

The surface-treated substrates obtained from Examples 26 to 32 and Comparative Examples 7 to 15 were subjected to <Measurement of contact angle of water> in the same manner as in Example 2. The results are shown in Table 5. Note that, the metal substrates (W, Wo) were not rendered water repellent in each case.

TABLE 5

| | Silylation agent (A) | Baking | Contact angle of water (°) $SiO_x$ |
|---|---|---|---|
| Example 26 | BDMADMS | Yes | 102.0 |
| Comparative Example 7 | | No | 89.8 |
| Example 27 | BDMAMS | Yes | 105.9 |
| Comparative Example 8 | | No | 101.2 |
| Example 28 | BDMADES | Yes | 100.5 |
| Comparative Example 9 | | No | 96.5 |
| Example 29 | BDMAVMS | Yes | 91.7 |
| Comparative Example 10 | | No | 86.1 |
| Example 30 | BDMAPMS | Yes | 85.0 |
| Comparative Example 11 | | No | 84.1 |
| Example 31 | BDMADPS | Yes | 87.4 |
| Comparative Example 12 | | No | 77.3 |
| Example 32 | TDMAMS | Yes | 91.4 |
| Comparative Example 13 | | No | 54.8 |
| Comparative Example 14 | — | Yes | 36.4 |
| Comparative Example 15 | — | No | 36.4 |

As is clear from the results shown in Table 5 above, even though the silylation agent was changed, the insulator substrate ($SiO_x$) was rendered water repellent, but the metal substrates (W, Wo) were not rendered water repellent, as is the case for Example 2, as long as the organomonosilane in which 2 or more and 4 or less nitrogen atoms were bonded to a silicon atom was used. Therefore, it can be said that the insulator substrate ($SiO_x$) can be selectively rendered water repellent compared to the metal substrates (W, Wo). Note that, it can be also seen that the baking is extremely effective for satisfactorily rendering the substrate water repellent. Even though the silylation agent was changed as long as the organomonosilane in which 2 or more and 4 or less nitrogen atoms were bonded to a silicon atom was used, it is presumed that the ALD film formation on the insulator substrate ($SiO_x$) are significantly inhibited in the ALD film formation test, but the ALD film formation on the metal substrates (W, Wo) are not inhibited, as is the case for Example 2, and the ALD film formation can be selectively inhibited on the insulator substrate ($SiO_x$) compared to the metal substrates (W, Wo), which is possibly because the film derived from the silylation agent (A) have a high molecular weight as is the case for Example 1.

Comparative Examples 16 to 18

Substrates that had been surface-treated were obtained in the same manner as in Example 2, except that polydimethylsiloxanes P1 to P3 as described below were used instead of bis(dimethylamino)dimethylsilane(BDMADMS). The polydimethylsiloxanes used are shown in Table 6. Note that, mass average molecular weights of the polydimethylsiloxanes are mass average molecular weights in terms of polystyrene determined by gel permeation chromatography (GPC).

[Chem. 4]

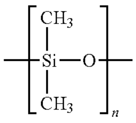

P1: Polydimethylsiloxane having a mass average molecular weight of 117000

P2: Polydimethylsiloxane having a mass average molecular weight of 2000

P3: Polydimethylsiloxane having a mass average molecular weight of 237

The surface-treated substrates obtained from Comparative Examples 16 to 18 were subjected to <Measurement of contact angle of water> and <ALD film formation test of $Al_2O_3$> in the same manner as in Example 2. The results are shown in Table 6.

TABLE 6

| | Polydimethyl siloxane | Contact angle of water (°) | | Film thickness of $Al_2O_3$ (nm) | |
|---|---|---|---|---|---|
| | | $SiO_x$ | W | $SiO_x$ | W |
| Comparative Example 16 | P1 | 134.7 | 134.8 | 1.111 | 2.357 |
| Comparative Example 17 | P2 | 104.3 | 103.9 | 0.751 | 0.882 |
| Comparative Example 18 | P3 | 51.9 | 33.9 | 4.643 | 4.141 |

As is clear from the results shown in Table 6 above, when the polysiloxanes were used rather than the organomonosilane in which 2 or more and 4 or less nitrogen atoms were bonded to a silicon atom, a difference in water repellency between the insulator substrate ($SiO_x$) and the metal substrates (W, Wo) is small. Therefore, it cannot be said that the substrate is selectively rendered water repellent. When the polysiloxanes were used rather than the organomonosilane in which 2 or more and 4 or less nitrogen atoms were bonded to a silicon atom, a difference in an inhibiting effect for the ALD film formation between the insulator substrate ($SiO_x$) and the metal substrates (W, Wo) is small. Therefore, it cannot be said that the ALD film formation is selectively inhibited.

Example 33

(Surface Treatment)

A silicon thermal oxide film substrate ($SiO_x$), a tungsten substrate (W), and a molybdenum substrate (Mo) were surface-treated using the surface treatment agent of Example 2 according to the following method. Specifically, the substrates were pretreated by dipping them in an aqueous HF solution having a concentration of 0.5% by mass at room temperature (25° C.) for one minute. After the pretreatment, the substrates were cleaned with ion-exchanged distilled water for one minute. The substrates which had been cleaned with water were dried with a nitrogen stream. The thus-dried substrates were dipped in (exposed to) the surface treatment agent at room temperature for 1 minute, removed, and then dried with a nitrogen stream. Next, the substrates which had been dried with a nitrogen stream were placed in a heating furnace and heated (baked) at 150° C. for 30 minutes. Then, the thus-baked substrates were cleaned (rinsed) by dipping them in isopropanol and stirring for one minute, and then cleaned (rinsed) with ion-exchanged distilled water for one minute. The substrates were cleaned at room temperature. Note that, the substrates were not rinsed with a liquid between the coating with (exposure to) the surface treatment agent of the substrates and the baking. The thus-cleaned substrates were dried with a nitrogen stream, thereby obtaining a surface-treated substrate.

Comparative Example 19

A substrate that had been surface-treated was obtained in the same manner as in Example 33, except that the baking was not performed.

Comparative Example 20

(Preparation of Surface Treatment Agent)

A surface treatment agent of Comparative Example 20 was prepared by uniformly mixing propylene glycol monomethyl ether acetate (S1) serving as the solvent with bis(dimethylamino)dimethylsilane (BDMADMS) serving as the silylation agent (A) and imidazole serving as the nitrogen-containing heterocyclic compound (B) so as to have concentrations of 10% by mass and 7% by mass, respectively.

(Surface Treatment)

A substrate that had been surface-treated was obtained in the same manner as in Example 33, except that the surface treatment agent of Comparative Example 20 was used instead of the surface treatment agent of Example 2.

Comparative Example 21

A substrate that had been surface-treated was obtained in the same manner as in Comparative Example 20, except that the baking was not performed.

Comparative Example 22

The silicon thermal oxide film substrate ($SiO_x$) which was the same as used in Example 33 was pretreated by dipping it in an aqueous HF solution having a concentration of 0.5% by mass at room temperature (25° C.) for 1 minute, cleaned with ion-exchanged distilled water for 1 minute, and dried with a nitrogen stream. The thus-obtained substrate was used as a substrate of Comparative Example 22.

The surface-treated substrates obtained from Example 33 and Comparative Examples 19 to 22 were subjected to <Measurement of contact angle of water> and <ALD film formation test of $Al_2O_3$> in the same manner as in Example 2. The results are shown in Table 7. Note that, the metal substrates (W, Wo) were not rendered water repellent and the ALD film formation with $Al_2O_3$ was not inhibited in each case.

TABLE 7

| | Nitrogen-containing heterocyclic compound (B) | Baking | Contact angle of water (°) $SiO_x$ | Film thickness of $Al_2O_3$ (nm) $SiO_x$ |
|---|---|---|---|---|
| Example 33 | No | Yes | 88.2 | 0.621 |
| Comparative Example 19 | No | No | 85.0 | 0.873 |
| Comparative Example 20 | Yes | Yes | 90.0 | 0.656 |
| Comparative Example 21 | Yes | No | 89.4 | 0.751 |
| Comparative Example 22 | — | — | 44.9 | 1.584 |

As is clear from the results shown in Table 7 above, Example 33 in which the surface treatment agent did not include the nitrogen-containing heterocyclic compound and the baking was performed for the surface treatment rendered the insulator substrate ($SiO_x$) water repellent, but did not render the metal substrates (W, Wo) water repellent, as is the cases for Comparative Example 19 in which the surface treatment agent did not include the nitrogen-containing heterocyclic compound and the baking was not performed for the surface treatment, Comparative Example 20 in which the surface treatment agent included the nitrogen-containing heterocyclic compound and the baking was performed for the surface treatment, and Comparative Example 21 in which the surface treatment agent included the nitrogen-containing heterocyclic compound and the baking was not performed for the surface treatment. The insulator substrate ($SiO_x$) and the metal substrates (W, Wo) had greatly different contact angles from each other. Note that, a degree of water-repellency (contact angle) of the insulator substrate ($SiO_x$) was comparable between Example 33 and Comparative Examples 19 to 21. On the other hand, it can be said that Example 33 can selectively inhibit the ALD film formation on the insulator substrate ($SiO_x$) compared to the metal substrates (W, Wo) to a greater extent than Comparative Examples 19 to 21 which are comparable with Example 33 with respect to water repellency in the ALD film formation test. It is presumed that this is because the film derived from the silylation agent (A) in Example 33 had a high molecular weight as is the case for Example 1.

As also is clear from the results shown in Table 7 above, it can be said that when the baking was not performed, inclusion of the nitrogen-containing heterocyclic compound in the surface treatment agent improves water repellency of the insulator substrate ($SiO_x$) and an inhibiting effect for the ALD film formation on the insulator substrate ($SiO_x$), but when the baking was performed, inclusion of the nitrogen-containing heterocyclic compound in the surface treatment agent decreases the inhibiting effect for the ALD film formation on the insulator substrate ($SiO_x$).

As also is clear from the results shown in Table 7 above, it can be said that, when the surface treatment agent did not include the nitrogen-containing heterocyclic compound, the baking improves the inhibiting effect for the ALD film formation on the insulator substrate ($SiO_x$) to a greater extent than when the surface treatment agent included the nitrogen-containing heterocyclic compound.

What is claimed is:

1. A method for treating a surface of a substrate, the method comprising:

preparing a substrate having a surface comprising two or more regions made of different materials from each other;

exposing the surface of the substrate to a surface treatment agent; and baking the substrate after the exposing, wherein the surface of the substrate is not rinsed with a liquid between the exposing and the baking, the surface treatment agent comprises a silylation agent (A) but not a nitrogen-containing heterocyclic compound (B), the silylation agent (A) comprises an organomonosilane, and the organomonosilane comprises 2 or more and 4 or less nitrogen atoms bonded to a silicon atom, wherein the baking is conducted at 150° C. or more and 500° C. or less for 0.5 to 50 minutes, and wherein after the surface treatment, a difference in contact angle of water between the two or more regions is 80° or more.

2. The method for treating a surface of a substrate according to claim 1, wherein the two or more regions comprise at least one insulator region and at least one metal region.

3. The method for treating a surface of a substrate according to claim 2, wherein the insulator is one or more selected from the group consisting of silicon oxide, aluminum oxide, titanium oxide, zirconium oxide, hafnium oxide, tantalum oxide, fluorine-containing silicon oxide, carbon-containing silicon oxide, silicon nitride, boron nitride, silicon carbide, silicon carbonitride, silicon oxynitride, silicon oxycarbonitride, silicon, and silicon doped with one or more selected from phosphorus, boron, and germanium, and the metal is one or more selected from the group consisting of tungsten, chromium, molybdenum, copper, cobalt, aluminum, silver, nickel, titanium, gold, ruthenium, titanium nitride, and tantalum nitride.

4. The method for treating a surface of a substrate according to claim 1, wherein the organomonosilane comprises a compound represented by Formula (1) below:

(1)

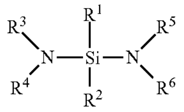

wherein $R^1$ and $R^2$ each independently represents a hydrogen atom, a nitrogen-containing group, or an organic group, and a total number of carbon atoms comprised in $R^1$ and $R^2$ is 1 or more; and $R^3$ to $R^6$ each independently represents a hydrogen atom, a saturated or unsaturated alkyl group, a saturated or unsaturated cycloalkyl group, an acetyl group, or a saturated or unsaturated hetero-cycloalkyl group.

5. The method for treating a surface of a substrate according to claim 1, wherein, in the exposing, the surface treatment agent is applied on the surface of the substrate by a spin coating method.

6. A method for region-selectively producing a film on a surface of a substrate, the method comprising:

treating the surface of the substrate by the method for treating a surface of a substrate according to claim 1; and forming a film by an atomic layer deposition method on the surface of the substrate that has been surface-treated, wherein a material of the film is deposited in region-selectively different amounts.

* * * * *